US006391523B1

(12) United States Patent
Hurditch et al.

(10) Patent No.: US 6,391,523 B1
(45) Date of Patent: May 21, 2002

(54) FAST DRYING THICK FILM NEGATIVE PHOTORESIST

(75) Inventors: Rodney J. Hurditch, Providence, RI (US); Daniel J. Nawrocki, Newton; Donald W. Johnson, Wayland, both of MA (US)

(73) Assignee: MicroChem Corp., MA (US)

( * ) Notice: Subject to any disclaimer, the term of this patent is extended or adjusted under 35 U.S.C. 154(b) by 13 days.

(21) Appl. No.: 09/748,422

(22) Filed: Dec. 26, 2000

Related U.S. Application Data

(60) Provisional application No. 60/232,737, filed on Sep. 15, 2000.

(51) Int. Cl.$^7$ .............................................. G03F 7/004
(52) U.S. Cl. ...................... 430/280.1; 522/66; 522/31
(58) Field of Search ......................... 430/280.1; 522/66

(56) References Cited

U.S. PATENT DOCUMENTS

| | | | |
|---|---|---|---|
| 4,882,245 A | | 11/1989 | Gelorme et al. ............... 430/14 |
| 4,940,651 A | | 7/1990 | Brown et al. ................ 430/325 |
| 5,026,624 A | | 6/1991 | Day et al. .................. 430/280.1 |
| 5,304,457 A | | 4/1994 | Day et al. .................. 430/280.1 |
| 5,494,943 A | * | 2/1996 | Mahoney et al. ............. 522/66 |
| 5,667,934 A | * | 9/1997 | Markovich et al. ....... 430/280.1 |
| 5,859,655 A | | 1/1999 | Gelorme et al. ............... 347/65 |
| 5,863,699 A | * | 1/1999 | Asakawa et al. ......... 430/280.1 |
| 6,193,359 B1 | * | 2/2001 | Patil et al. ..................... 347/65 |

OTHER PUBLICATIONS

Material Safety Data Sheet, Cyclopentanone, 99+%, ACC#66717 at http://camel2.conncoll.edu/offices/envhealth/MSDS/chemistry/C/Cyclopenanone–99.htm, five pages last revised Feb. 8, 2000.* http://aveclafaux.freeservers.com/SU–8.html, SU–8: A Thick Photo–Resist For Mems, Dated Feb. 28, 2002, 18 Pages When Transferred To Microsoft Word To Print.*

Shaw et al, "Improving the Process Capability of SU–8" MicroCHem Corp., Newton MA, 02464, found on internet at www.microchem.com/resources/su8_process _capability_paper_1.pdf GOOGLE search of butanone cyclopentanone flash point. Date Mar. 2, 2002, 9 pages.*

State of Knowledge Report: Air Toxics and Indoor Air Quality in Australia 2001, Air Toxic—Methyl ethyl ketone, three pages, last undated Sep. 5, 2001, http://www.ea.gov.au/atmosphere/airtoxics/sok/profiles/methy.html. three pages.*

Material Safety Data Sheet, Revised Feb. 21, 2001, MSDS methyl Amyl Ketone, http://www.americhemsales.com/MSDS%20HTMLS/156635v4.htm, 7 pages.*

Sotec Microsystems web page http://dmtwww.epfl.ch/~lguerin/SU8NF.html, downloaded May 22, 2000.

Microcmachining Applications of a High Resolution Ultrathick Photoresist, K.Y. Lee et al., *J. Vac. Sci. Technol. B* 13 (6), Nov/Dec 1995.

High Aspect Ratio Resist for Thick Film Applications, N. LaBianca et al., *SPIE* vol. 2438, Mar. 1995, pp. 846–852.

* cited by examiner

*Primary Examiner*—Cynthia Hamilton
(74) *Attorney, Agent, or Firm*—William A. Simons; Wiggin & Dana

(57) ABSTRACT

A composition useful for a thick-film negative resist comprising a mixture of at least one epoxidized polyfunctional bisphenol A formaldehyde novolak resin and at least one photoacid generator in a coating solvent, a majority amount of said coating solvent being cyclopentanone.

5 Claims, No Drawings

FAST DRYING THICK FILM NEGATIVE PHOTORESIST

This application claims priority from provisional application Ser. No. 60/232,737, filed Sep. 15, 2000.

BACKGROUND OF THE INVENTION

1. Field of the Invention

The present invention relates to photoimageable epoxy compositions useful as photoresists for applications requiring thick films. In particular, this invention relates to specific composition useful for that purpose that contains cyclopentanone as a solvent, at least one epoxidized polyfunctional bisphenol A formaldehyde novolak resin and at least one photoacid generator.

2. Brief Description of Art

Advanced packaging applications requiring solder bumps having a high aspect ratio (i.e., ratio of the film thickness or height to the width of the developed imaged feature) and applications involving the fabrication of micro electromechanical machines (MEMS) require photoresists which are capable of producing uniform layers by spin-coating, providing high aspect ratio images up to thicknesses of several hundred microns. Conventional positive resists based on diazonaphthoquinone-novolak chemistry are not suitable for applications for which the thickness is required to be above about 50–60 microns. This thickness limitation is primarily caused by the relatively high optical absorption of the diazonapthoquinone-type photoactive compound at the near-ultraviolet wavelengths (350–450 nm) which are typically used to expose the resist. Optical absorption necessarily reduces the radiation intensity as it traverses from the top to the bottom of the film, such that if the optical absorption is too high, the bottom of the film will be underexposed relative to the top, causing a tapered or otherwise distorted profile of the developed image.

A negative spin-coating thick-film resist of the chemically amplified type, which has very low optical absorbance at wavelengths in the 350–450 nm range has been described in the literature (N. LaBianca and J. D. Gelorme, Proc. SPIE Vol. 2438, page 846 (1995). This resist comprises a solution in a coating (casting) solvent of a polyfunctional epoxy novolak resin EPON® SU-8 from Shell Chemical and a triphenyl sulfonium hexafluoroantimonate salt (PAG), such as CYRACURE UVI 6974 from Union Carbide. The EPON SU-8 has a high functionality which results in efficient cross-linking, so the resist is capable of forming images having a high aspect ratio in films which may be 300 microns or more thick. The PAG is added at a concentration of less than 10% of the total solids. The disclosed coating solvent uses a mixture of gamma-butyrolactone (GBL) and methyl ethyl ketone (2-butanone). The resulting photoresist solution may be spin-coated onto a wide variety of substrates, pre-baked to evaporate the solvent, leaving a solid photoresist film of up to several hundred microns thickness depending on the solids content of the solution. A pattern is transferred to the photoresist by exposing the film through a mask to near-ultraviolet radiation by contact, proximity, or projection exposure. Subsequent immersion in developer solution dissolves away the unexposed regions, leaving behind a high resolution three dimensional negative image of the mask.

A further reference (K. Y. Lee, N. LaBianca, S. A. Rishton, J. D. Gelorme, J. Shaw and T. H. P. Chang, J. Vac. Sci. Technology B 13(6), 1995) discloses similar spin-coating photoresist compositions, in which the solvent is the single solvent gamma-butyrolactone.

Previous disclosures of thick-film negative photoresist compositions containing SU-8 resin, and a solvent are as follows: U.S. Pat. No. 4,882,245, assigned to International Business Machines Corp. discloses preferred photocurable compositions suitable for use in a printed circuit board which contain up 88% by weight of SU-8 resin, CYRACURE PAG, a reactive diluent epoxy resin and methyl ethyl ketone or methyl isobutyl ketone (4-methyl-2-pentanone) or mixtures thereof as the solvent. The preferred solvent was methyl ethyl ketone alone. These compositions are applied to a cured epoxy resin substrate by means of a doctor-blade and not by the spin-coating method of the present invention.

U.S. Pat. No. 5,026,624, assigned to International Business Machines Corp. discloses a preferred photocurable compositions suitable for use as a solder mask which contain up 90% by weight of SU-8 resin, CYRACURE PAG, a reactive diluent epoxy resin and a solvent selected from gamma-butyrolactone, N-methyl pyrrolidinone, 2-ethoxyethyl acetate, propylene carbonate, 2-methoxyethanol, propylene glycol monomethyl ether or propylene glycol monomethyl ether acetate. The preferred solvent was propylene glycol monomethyl ether acetate. These compositions are applied to a cured epoxy resin substrate by means of curtain coating and not by the spin-coating method of the present invention.

Negative photoresists based on the above disclosed compositions which are suitable for spin-coating, in which the solvent is gamma-butyrolactone alone, are sold by Micro-Chem Corp., Newton, Mass., USA and used commercially, especially in the fabrication of MEMS devices. For example, a typical product offered by MicroChem Corp., "SU8–50" can be spin-coated at 1000–3000 rpm to produce films of thickness in the range 30–100 microns, which after exposure and development according to a standardized process can produce images having an aspect ratio greater than 10:1 at film-thicknesses greater than 100 microns. Higher or lower solids versions extend the film-thickness range obtainable by a single coat process to below 5 microns and above 200 microns. Gamma-butyrolactone is selected as the solvent for these photoresist compositions primarily because of its high solvency of the SU-8 epoxy bisphenol A resin, and because it is non-flammable. Additionally, the viscosity of a solution containing a high concentration of solids required for a very thick film resist can reduced substantially by heating to a moderate temperature, thus making it practical to be filtered under reasonable pressure to remove particles or gels.

The choice of the coating (casting) solvent is critical. The use of a low boiling point high volatility coating solvent, such as methyl ethyl ketone, which has a vapor pressure of 100 mm at 25° C., may cause the photoresist film to dry too quickly resulting in an uneven surface. The mask pattern to be imaged cannot then be transferred uniformly across the area of the film. If the film is not dried sufficiently, the surface will remain tacky, in which case the film will stick to the mask if contact printing is used to transfer the pattern. Additionally, a stable image may not be formed. It is thus generally preferable to use a relatively high boiling point low volatility coating solvent with a vapor pressure of less than about 10 mm for photo resists which are to be deposited as uniform films by spin-coating.

However, the drying time, which increases rapidly with film-thickness, may become rather long if a low volatility solvent is used for a thick-film forming resist composition. This makes the resist unsuitable for use in production processes in which high throughput is important. In the case of the above disclosed compositions using as the solvent gamma-butyrolactone which has an extremely low vapor pressure of 0.3 mm, the drying time at practical bake temperatures (typically below about 100° C.) is in the range of 10–90 minutes for film-thicknesses in the 20100 micron range. Furthermore, the coating uniformity tends to be poor towards the outer edge of the substrate due to the formation of a rather large edge-bead, and the resist solution may not wet the surface of the substrate sufficiently resulting in uneven spreading, de-wetting or pulling-back of the film from the edge of the substrate after spin-coating or after soft bake. This occurs particularly on substrates such as bare silicon, silicon nitride, glass, or certain metals such as copper. Although the wettability of the substrate may be improved, for example, by treating bare silicon by means of sulfuric acid/hydrogen peroxide followed by hydrofluoric acid etching (piranha etch), or by using a selected primer, this adds to the complexity of the coating process, and in the case of certain primers can lead to additional problems such as lifting-off of imaged features during development.

Reducing the drying time by mixing a high volatility solvent with gamma-butyrolactone is possible; however, this is undesirable because the composition of the solvent mixture can change during mixing with the solid resist components due to loss by evaporation of the highly volatile solvent, which makes the manufacture unnecessarily complex. Furthermore, the solubility may decrease and a higher solids content may be required to achieve the same film thickness as would be obtained using gamma-butyrolactone alone. Furthermore, solvents of high volatility have flash points below room temperature. Such mixtures in which methyl ethyl ketone is the volatile solvent are not used commercially because methyl ethyl ketone is a known toxic substance.

BRIEF SUMMARY OF THE INVENTION

Therefore, the present invention is directed to a composition useful for a thick-film negative resist comprising a mixture of at least one epoxidized polyfunctional bisphenol A formaldehyde novolak resin, at least one photoacid generator, and wherein cyclopentanone comprises at least the majority amount (i.e., at least 50% by weight) of the casting solvent. The resulting mixtures having a wide range of total solids content, may be applied by spin-coating in a single coating step to a variety of substrates, and baked to produce tack-free non-brittle films having a range of thickness up to several hundred microns.

An advantage of the present invention is the fast drying time, which is afforded with uniform coatings and with no increase in cracking of the film during the drying process or during the post-exposure bake.

Another advantage is the improved wetting obtained on different substrates such as bare silicon, glass, silicon nitride and other surface coatings commonly used for MEMS applications.

Yet another advantage is that cyclopentanone may be used without a co-solvent.

Yet another advantage is that only a small increase in the solids concentration is required to achieve the-same film thickness as would be obtained using gamma-butyrolactone. Furthermore, cyclopentanone solvent is not known to be toxicologically hazardous and has a flash point above room temperature.

DETAILED DESCRIPTION OF THE INVENTION

As stated above, the present invention is directed to a composition comprising:

(a) at least one particular polyfunctional epoxy resin which is capable of undergoing ring-opening polymerization under the influence of a strong acid catalyst.
(b) at least one particular photoacid generator which releases a strong acid under the influence of ultraviolet light,
(c) cyclopentanone as the major component of a solvent which is capable of dissolving all ingredients. Optionally, a surfactant may be added to further improve coating uniformity.

The term "epoxidized polyfunctional" as used herein to describe bisphenol A formaldehyde novolak resins includes any and all resins of this class that contain sufficient epoxy functionalities to be useful as a thick-film negative photoresist. The preferred epoxy resin contains an average of eight epoxy groups, consisting of the glycidyl ether of the novolak condensation product of bisphenol A and formaldehyde, with an average molecular weight of about 1400 gram/mole, with an epoxy equivalent weight of about 215 gram/mole. Such a resin is commercially available from Shell Chemical under the trade name EPON® Resin SU-8. The structure of the most common component of the resin having an epoxy functionality of eight is shown in Formula (1)

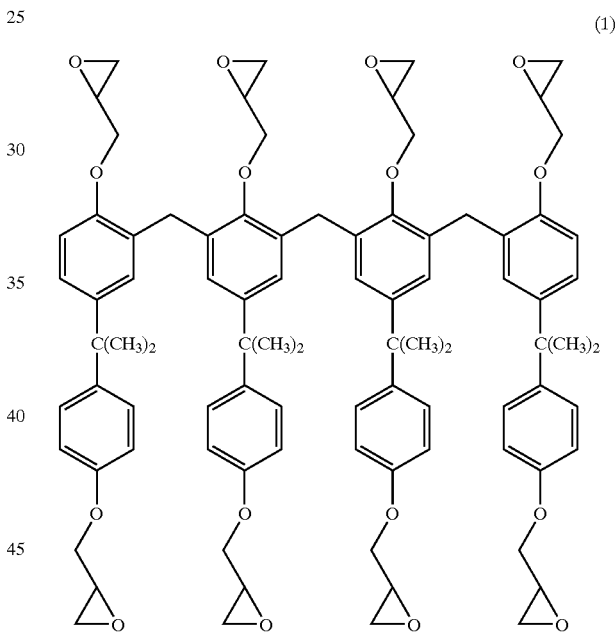

(1)

The preferred photoacid generator consists of a triaryl sulfonium salt with structure shown in Formula (2), where Ar represents a mixture of aryl groups. Such a material is commercially available from Union Carbide under the trade name CYRACURE® Photoacid Generator UVI-6974, which consists of a 50 % solution of the triaryl sulfonium salt of Formula (2) dissolved in propylene carbonate.

(2)

Cyclopentanone may be used as a single solvent or as the major component being not less than 50% in a mixture with a co-solvent capable of dissolving the solid components. Suitable co-solvents are polar solvents such as dimethylformamide and N-methyl pyrrolidinone, ketonic solvents such as, cyclohexanone, heptanone, methylamyl ketone and methyl isopropyl ketone, cyclic ethers such as 1,3-dioxolane and tetrahydofuran, hydroxylic polar solvents such as tetrahydrofurfuryl alcohol, ethyl lactate, propyleneglycol methylether, propyleneglycol methylether acetate, methylmethoxy propionate, 2-ethoxyethyl acetate, propylene carbonate, 2-methoxyethanol, ethylethoxypropionate and the like. More preferably, the coating comprises either all cyclopentanone or about 70%–95% cyclopentanone and about 5–30% by weight of one or more of those cosolvents.

Other additives, well known to those skilled in the art, which may be optionally used to improve the coating quality of a spin-coating resist formulation include leveling agents, wetting agents and adhesion promoters, such a nonionic surfactants may be preferably added at about 0.02 to 0.1% by weight. One suitable nonionic surfactant is FC430 from 3M.

A solution of the components suitable for spin-coating is formed by dissolving the polyfunctional epoxy bis-phenol A novolak resin, the photoacid generator and other additives if used in the selected coating solvent system comprising as the major component cyclopentanone. The resin is typically dissolved in the solvent system to a concentration of about 30-to 80 wt %. The photoacid generator (as a solid), is typically present in an amount of about 2 to 6 parts per hundred of the resin, or as a solution in propylene carbonate in an amount of about 4 to 12 parts per hundred. The solution is filtered through a polypropylene or Teflon filter to remove particulate matter. The pore size varies from about 2 to about 10 microns depending on the total solids content of the solution. The photoresist coating is formed by spin-coating the solution onto a substrate to form a uniform thick-film of thickness of at least about 20 microns, preferably 20–300 microns.

The types of substrates can be, but are not limited to, silicon, glass or ceramic which may have deposited on their surface other materials such as silicon oxide, silicon nitride, various metals such as gold, copper or nickel, or alloys.

No special pre-treatment is necessary; optionally, a prebake may be performed to remove absorbed moisture. The resulting photoresist solution may be applied to a substrate by spin-coating, consisting of dispensing the liquid resist onto the substrate, accelerating to a constant rotational speed, and holding the rotation speed constant to achieve the desired coating thickness. Spin-coating may be performed with variable rotational velocity in order to control the thickness of the final coating. After spin-coating, a bake is performed to evaporate the solvent; typically 1 minute at 65SC followed by 5–15 minutes at 95° C. depending on the film-thickness. The solid photoresist coating can then be photoimaged using an exposure tool with near-ultraviolet radiation from a medium- or high-pressure mercury lamp through a photomask containing a pattern of opaque and transparent regions. Contact, proximity, or projection printing may be used, preferably contact printing. Following exposure, a post-exposure-bake is carried out in order to accelerate the acid catalyzed polymerization reaction in the exposed regions of the coating; typical bakes are carried out for 1 minute at 65° C. and 5–20 minutes at 95° C. depending on the film-thickness. The coating is then developed in an organic solvent developer in order to dissolve away the un-polymerized regions, typically for 2–10 minutes depending on the film-thickness. Suitable developer solvents include, but are not limited to, propylene glycol methyl ether acetate, gamma-butyrolactone, diacetone alcohol and ethyl lactate. Optionally, a post-bake may be performed on the resulting image to more fully harden the material.

The resulting three dimensional structures obtained in the described fashion may be used for electroplating molds, microelectromechanical systems (MEMS) devices, microfluidic devices, and other applications apparent to those skilled in the art.

The present invention is further described in detail by means of the following Examples and Comparative Examples. All parts or percentages are by weight and all temperatures are in degrees Celsius unless explicitly stated otherwise.

EXAMPLE 1

A composition comprising a mixtures of EPON SU-8 resin obtained from Shell Chemicals, present in an amount of 66.8% of the total weight of components, and CYRACURE 6974 photoacid generator (6.7 wt % of the total weight of components), and 26.5 wt % of cyclopentanone, was prepared by placing the mixture in an amber glass bottle and rolling on ajar roller under moderate heat (about 50–70° C. ) until all the solids were completely dissolved (about 4 hrs). The hot solution was filtered through a 5 micron teflon membrane filter. About 5 mls of the solution was dispensed by pipette onto a bare silicon wafer mounted on the chuck of a Brewer Science CEE spin-coater which was ramped quickly from an initial speed 500 of rpm to a maximum spin-speed of 3000 rpm and held for 30 seconds: The resulting partially dry film was visually inspected and found to be free of striations or ridges. The coated wafer was transferred to a hot-plate at an initial temperature of 65° C. The temperature was increased to 95° C. The drying time to achieve a tack-free surface of the film was determined as follows: At intervals of one to five minutes depending on the film-thickness, the coated wafer was removed from the hot-plate, allowed to cool to room temperature and a metal probe brought into contact with the surface. The tack-free condition was attained when the film no-longer adhered to the probe tip. The procedure was repeated as required to obtain a more accurate determination.

The drying time determined by the above procedure was found to be 7 minutes and during the bake process no bubbling or pitting of the film surface was observed to occur and the dry film thickness was found to be 68.7 microns. The resulting dry film was visually inspected and had not pulled-back from the edge or otherwise de-wetted from the substrate.

The film thickness was measured using either a Zeiss light-section microscope for thickness values above about 30 microns and by means of a NanoSpec interferometer for thickness values below about 30 microns.

The dry photoresist film was exposed to patterned near-ultraviolet radiation having a principle wavelength of 365 nm through a chromium-on-quartz resolution mask which was placed in contact with the surface of the film. After a suitable exposure time determined by trail-and-error, as that required to transfer the mask pattern as accurately as possible to the resist film, the exposed areas were cross-linked by a post-exposure bake at 95° C. for 6 minutes. The unexposed un-crosslinked areas were dissolved by immersion in a bath containing propyleneglycolmethylether acetate, resulting in a negative image of the mask. The developed resolution patterns were examined through a microscope and the aspect ratio defined as the ratio of the film-thickness to the width (at the bottom of the photoresist film) of the smallest completely resolved feature was found to be 9.8:1.

EXAMPLE 2

The method according to Example 1 was repeated except that the maximum spin-speed was 1000 rpm and the post-exposure bake time was 18 minutes. The film showed complete absence of de-wetting, surface striations or ridges, and no bubbling or pitting was observed during the bake. The drying time was 35 minutes, the film-thickness was 181 microns, and the aspect ratio was 9:1

EXAMPLE 3

The method according to Example 1 was repeated, except that the resin was present in an amount of 60.5 wt % and cyclopentanone was present in an amount of 33.5 wt % and the post-exposure bake time was 3 minutes. The film showed complete absence of de-wetting, surface striations or ridges, and no bubbling or pitting was observed during the bake. The drying time was 3 minutes, the film-thickness was 19.3 microns, and the aspect ratio was 4.8:1.

EXAMPLE 4

The method according to Example 3 was repeated, except that the spin speed was 1000 rpm and the post-exposure bake time was 5 minutes. The film showed complete absence of de-wetting, surface striations or ridges, and no bubbling or pitting was observed during the bake. The drying time was 6 minutes, the film-thickness was 51.4 microns, and the aspect ratio was 5:1.

EXAMPLE 5

The method according to Example 1 was repeated, except that the resin was present in an amount of 50 wt % and the solvent in an amount of 45 wt % and the post-exposure bake time was 2 minutes. The film showed complete absence of de-wetting, surface striations or ridges, and no bubbling or pitting was observed during the bake. The drying time was 2 minutes, the film-thickness was 8.3 microns, and the aspect ratio was 3:1.

EXAMPLE 6

The method according to Example 5 was repeated, except that the spin-speed was 1000 rpm and the post-exposure bake time was 2 minutes. The film showed complete absence of do-wetting, surface striations or ridges, and no bubbling or pitting was observed during the bake. The drying time was 2 minutes, the film-thickness was 17.2 microns, and the aspect ratio was 3.4:1.

EXAMPLE 7

The method according to Example 4 was repeated, except that the substrate was polished borosilicate glass. The film showed complete absence of de-wetting, surface striations or ridges, and no bubbling or pitting was observed during the bake. The drying time was 6 minutes and the film-thickness was about 50 microns.

EXAMPLE 8

The method according to Example 4 was repeated, except that the substrate was silicon nitride deposited onto silicon. The film showed complete absence of de-wetting, surface striations or ridges, and no bubbling or pitting was observed during the bake. The drying time was 6 minutes and the film-thickness was about 50 microns.

COMPARATIVE EXAMPLE 1

The method according to Example 1 was repeated except that the solvent was gamma-butyrolactone. The film showed the complete absence of surface striations or ridges but had pulled back from the edge of the substrate. No bubbling or pitting was observed during the bake. The drying time was 75 minutes, the film-thickness was 93.8 microns and the aspect ratio was 9:1.

COMPARATIVE EXAMPLE 2

The method according to Example 3 was repeated except that the solvent was gamma-butyrolactone. The film showed the complete absence of surface striations or ridges, but had pulled back from the edge of the substrate and de-wetted in several other areas. No bubbling or pitting was observed during the bake. The drying time was 15 minutes, the film-thickness was 37.5 microns and the aspect ratio was 5:1.

COMPARATIVE EXAMPLE 3

The method according to Comparative Example 2 was repeated except that maximum spin-speed was 1000 rpm and the post-exposure bake time was 10 minutes. The film showed the complete absence of surface striations or ridges but had pulled back from the edge of the substrate. No bubbling or pitting was observed during the bake. The drying time was 90 minutes, the film-thickness was 101.6 microns and the aspect ratio was 9:1.

COMPARATIVE EXAMPLE 4

The method according to Example 3 was repeated except that the solvent was methyl ethyl ketone. After spin-coating and prior to baking, the film surface was uneven showing the presence of pronounced ridges. The film was not suitable for pattern transfer.

COMPARATIVE EXAMPLE 5

The method according to Example 3 was repeated except that the solvent was 2-pentanone. After spin-coating and prior to baking, the film surface was uneven showing pronounced striations. The film was not suitable for pattern transfer.

COMPARATIVE EXAMPLE 6

The method according to Example 3 was repeated except that the solvent was methyl isobutyl ketone. After spin-coating and prior to baking the film surface was uneven showing pronounced ridges. The film was not suitable for pattern transfer.

COMPARATIVE EXAMPLE 7

The method according to Example 3 was repeated except that the solvent was pinacolone. The film surface was free of striations and ridges. During the bake, severe bubbling and pitting was observed. The film was not suitable for pattern transfer.

COMPARATIVE EXAMPLE 8

The method according to Example 3 was repeated except that the solvent was methyl isopropyl ketone. The film surface was free of striations and ridges. During the bake, a slight amount of bubbling and pitting was observed. The drying time was less than two minutes and the film-thickness was 13.2 microns and the aspect ratio was 3.5:1.

COMPARATIVE EXAMPLE 9

The method according to Comparative Example 8 was repeated except that the spin-speed was 1000 rpm. The film surface was free of striations and ridges. During the bake, a slight amount of bubbling and pitting was observed. The drying time was less than three minutes and the film-thickness was 24.6 microns and the aspect ratio was 5:1.

COMPARATIVE EXAMPLE 10

The method according to Example 3 was repeated except that the solvent was a mixture of gamma-butyrolactone and methyl ethyl ketone in the ratio of 85:15 parts by weight. The film showed the complete absence of surface striations or ridges but had pulled back from the edge of the substrate. No bubbling or pitting was observed during the bake. The drying time was 5 minutes, the film-thickness was 25.6 microns and the aspect ratio was 4:1.

COMPARATIVE EXAMPLE 11

The method according to Comparative Example 10 was repeated except that the spin speed was 1000 rpm and the substrate was silicon nitride deposited on silicon. The film showed the complete absence of surface striations or ridges but had pulled back from the edge and de-wetted from other areas of the substrate. No bubbling or pitting. was observed during the bake. The drying time was 11 minutes, the film-thickness was 62.1 microns and the aspect ratio was 9:1.

Examples 1–8.and Comparative Examples 1, 2, 3 , 10 and 11 show that cyclopentanone as a single solvent produces even coatings having a wide range of film thickness, free from de-wetting on bare silicon, glass and silicon nitride, and after patterning produce photoimages which have aspect ratios comparable to those produced from coatings prepared with gamma-butyrolactone or a mixture of gamma-butyrolactone and methyl ethyl ketone as the solvent. In all cases the drying time is significantly faster than coatings of comparable thickness prepared using gamma-butyrolactone or a mixture of gamma-butyrolactone and methyl ethyl ketone as the solvent, and the wetting on bare silicon, and silicon nitride is superior.

Comparative Examples 4–7 show that selected ketones (having a relatively low boiling points and high vapor pressures) are unsuitable due to the surface unevenness resulting from rapid drying. Comparative examples 8 and 9 shows that methyl isopropyl ketone as a solvent reduces the film thickness obtained under the same spin-coat conditions to less than one half of that obtained using cyclopentanone at the same total solids concentration.

While the invention has been described above with reference to specific embodiments thereof, it is apparent that many changes, modifications, and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A composition useful for a thick-film negative resist comprising a mixture of at least one epoxidized polyfunctional bisphenol A formaldehyde novolak resin and at least one photoacid generator in a coating solvent, a majority amount of said coating solvent being cyclopentanone.

2. The composition of claim 1 wherein the at least one epoxidized polyfunctional bisphenol A formaldehyde novolak resin is one epoxy resin having an average of about eight epoxy groups and having an average molecular weight of about 1400 gram/mole and having an epoxy equivalent weight of about 215 gram/mole.

3. The composition of claim 1 wherein the photoacid generator is a triphenyl sulfonium hexafluoroantimonate salt.

4. The composition of claim 1 wherein the coating solvent is solely cyclopentanone.

5. The composition of claim 1 wherein the coating solvent comprises about 70% to about 95% by weight cyclopentanone and from about 5% to about 30% by weight of a cosolvent, said cosolvent selected from the group consisting of dimethyl formamide, N-methyl pyrrolidinone, cyclohexanone, heptanone, methyamyl ketone, methyl isopropyl ketone, 1, 3-dioxolane, tetrahydrofuran, tetrahydrofurfuryl alcohol, ethyl lactate, propyleneglycol methylether, propyleneglycol methylether acetate, methylmethoxy propionate, 2-ethoxyethyl acetate, propylene carbonate, 2-methoxyethanol, and ethylethoxypropionate.

* * * * *